(12) United States Patent
Gibson et al.

(10) Patent No.: US 6,680,542 B1
(45) Date of Patent: Jan. 20, 2004

(54) DAMASCENE STRUCTURE HAVING A METAL-OXIDE-METAL CAPACITOR ASSOCIATED THEREWITH

(75) Inventors: Gerald W. Gibson, Orlando, FL (US); Richard W. Gregor, Winter Park, FL (US); Chun-Yung Sung, Orlando, FL (US); Daniel J. Vitkavage, Winter Garden, FL (US); Allen Yen, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/575,214

(22) Filed: May 18, 2000

(51) Int. Cl.[7] .......................... H01L 23/48; H01L 29/00
(52) U.S. Cl. ........................ 257/774; 257/758; 257/532
(58) Field of Search .................. 257/758, 774, 257/296–313, 905–908, 532

(56) References Cited

U.S. PATENT DOCUMENTS

| | | | | |
|---|---|---|---|---|
| 5,708,559 A | * | 1/1998 | Brabazon et al. | 361/313 |
| 6,037,216 A | * | 3/2000 | Liu et al. | 438/253 |
| 6,117,747 A | * | 9/2000 | Shao et al. | 438/396 |
| 6,174,769 B1 | * | 1/2001 | Lou | 438/253 |
| 6,180,976 B1 | * | 1/2001 | Roy | 257/306 |
| 6,228,711 B1 | * | 5/2001 | Hsieh | 438/255 |
| 6,232,197 B1 | * | 5/2001 | Tsai | 438/393 |

FOREIGN PATENT DOCUMENTS

| | | | | |
|---|---|---|---|---|
| JP | 2000-208743 | * | 7/2000 | H01L/27/108 |
| JP | 2000-208745 | * | 7/2000 | H01L/27/108 |

* cited by examiner

Primary Examiner—Tom Thomas
Assistant Examiner—Ori Nadav

(57) ABSTRACT

The present invention provides a semiconductor device, including an interconnect and a capacitor, and a method of fabrication therefor. The method includes forming a damascene interconnect structure through an interlevel dielectric layer and a dielectric etch stop layer located under the interlevel dielectric, wherein the damascene interconnect structure contacts a first interconnect structure. The method further includes forming a metal-oxide-metal (MOM) capacitor damascene structure through the interlevel dielectric layer and terminating on the dielectric etch stop layer. The damascene structures, may in an alternative embodiment, be dual damascene structures. Furthermore, the damascene interconnect structure and the MOM capacitor may, in another embodiment, make up part of a larger integrated circuit.

10 Claims, 7 Drawing Sheets

DAMASCENE STRUCTURE HAVING A METAL-OXIDE-METAL CAPACITOR ASSOCIATED THEREWITH

TECHNICAL FIELD OF THE INVENTION

The present invention is directed, in general, to a semiconductor device having a damascene structure incorporated therein and, more specifically, to a semiconductor device having a damascene structure incorporated therein and a metal-oxide-metal capacitor associated with the damascene structure and a method of manufacture therefor.

BACKGROUND OF THE INVENTION

As is well known, various active devices and structures are commonly formed within an integrated circuit. These various active devices and structures are what allow fast, reliable and inexpensive integrated circuits to be manufactured for today's ever competitive computer and telecommunication markets.

Interconnects, have gained wide acceptance and use in today's integrated circuit technology. As is well known, the semiconductor industry is currently moving toward low dielectric constant (low-k) materials and copper metal to form such interconnects. This is a result of the semiconductor industries' desire to reduce resistive capacitance delays associated with the higher dielectric constant materials, and take advantage of the benefits of using copper as the interconnect metal.

However, certain problems are encountered when forming traditional copper interconnects. The main problem stems from the difficulty of etching the copper metal to create the interconnect. In response, the industry adopted damascene strategies for fabricating these interconnects. To fabricate such damascene interconnects, the damascene interconnect structure would first be etched into the low-k material, followed by filling the structure with metal, typically copper. A benefit of the damascene technique is that it has fewer manufacturing steps per completed metal layer. Considering that devices of the near future will require as many as seven inter-level connections, such as vias, and a corresponding number of intra-level connections, such as wires or lines, damascene processing should lead to considerable cost and performance gains over traditional interconnect processing. Additionally, damascene strategies where both the via and wire are patterned, simultaneously etched, and simultaneously filled with metal, further reduces the number of processing steps.

Metal-oxide-metal (MOM) capacitors have also gained wide acceptance and use in today's integrated circuit technology. One who is skilled in the art is readily aware that a MOM capacitor comprises two conductive plates or electrodes separated by a dielectric surface film. Conventional processes to form a MOM capacitor traditionally include depositing a first metal layer, depositing an oxide layer followed by an oxide CMP, then depositing a second metal layer. In those areas where the MOM capacitor is not required, a subtractive metal etch is often performed to define the area in which the MOM capacitor is to be located. Unfortunately, however, given present day techniques, the incorporation of a MOM capacitor into an integrated circuit that has a damascene interconnect system is extremely difficult. This is due to the difficulty of etching copper that is used to form the interconnects and the electrodes of the MOM capacitor.

Accordingly, what is needed in the art is a device that incorporates a MOM capacitor into an integrated circuit having damascene interconnects, while avoiding the problems associated with the prior art.

SUMMARY OF THE INVENTION

To address the above-discussed deficiencies of the prior art, the present invention provides a semiconductor device, including an interconnect and a capacitor, and a method of fabrication therefor. The method includes forming a damascene interconnect structure through an interlevel dielectric layer and a dielectric etch stop layer located under the interlevel dielectric, wherein the damascene interconnect structure contacts a first interconnect structure. The method further includes forming a metal-oxide-metal (MOM) capacitor damascene structure through the interlevel dielectric layer and terminating it on the dielectric etch stop layer. The damascene structures, may in an alternative embodiment, be dual damascene structures. Furthermore, the damascene interconnect structure and the MOM capacitor may, in another embodiment, make up part of a larger integrated circuit.

Thus, in one aspect, the present invention provides a device and method wherein a MOM capacitor is formed within a damascene interconnect structure. Because the MOM capacitor is formed within a damascene interconnect structure, the etching steps typically associated with conventional processes are avoided. Moreover, fewer processing steps are required, thereby saving production costs and time.

The MOM capacitor, may in another embodiment, include a first capacitor electrode, a capacitor dielectric and a second capacitor electrode. In yet another embodiment, the first capacitor electrode of the MOM capacitor may be a second interconnect structure, the capacitor dielectric may be the dielectric etch stop layer and the second capacitor electrode may be a metal that comprises the damascene interconnect structure. In other embodiments, the dielectric etch stop layer may comprise silicon nitride, the interlevel dielectric layer may comprise silicon dioxide and the metal that comprises the damascene interconnect structure may comprise copper. Moreover, in an alternative embodiment, the first and second electrodes of the MOM capacitor damascene structure are preferably comprised of copper.

In another aspect of the invention, a barrier layer may be formed within the MOM capacitor damascene structure. The barrier layer may in another aspect, be tantalum nitride, tantalum or titanium nitride. However, one having skill in the art knows that other compatible barrier layers may be used.

In a preferred embodiment, the damascene interconnect structure and the MOM capacitor damascene structure are formed with a single mask. In an alternative embodiment a damascene structure opening and a MOM capacitor damascene opening are formed down to the dielectric etch stop layer. However, in a different embodiment, the MOM capacitor damascene interconnect structure opening is filled with a photoresist while the dielectric etch stop layers in the damascene interconnect structure opening are removed. After removal of the photoresist, in another aspect of this particular embodiment, a barrier layer may be deposited within the damascene structure opening and the MOM capacitor damascene opening, followed by depositing a metal within the damascene structure opening and the MOM capacitor damascene opening.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
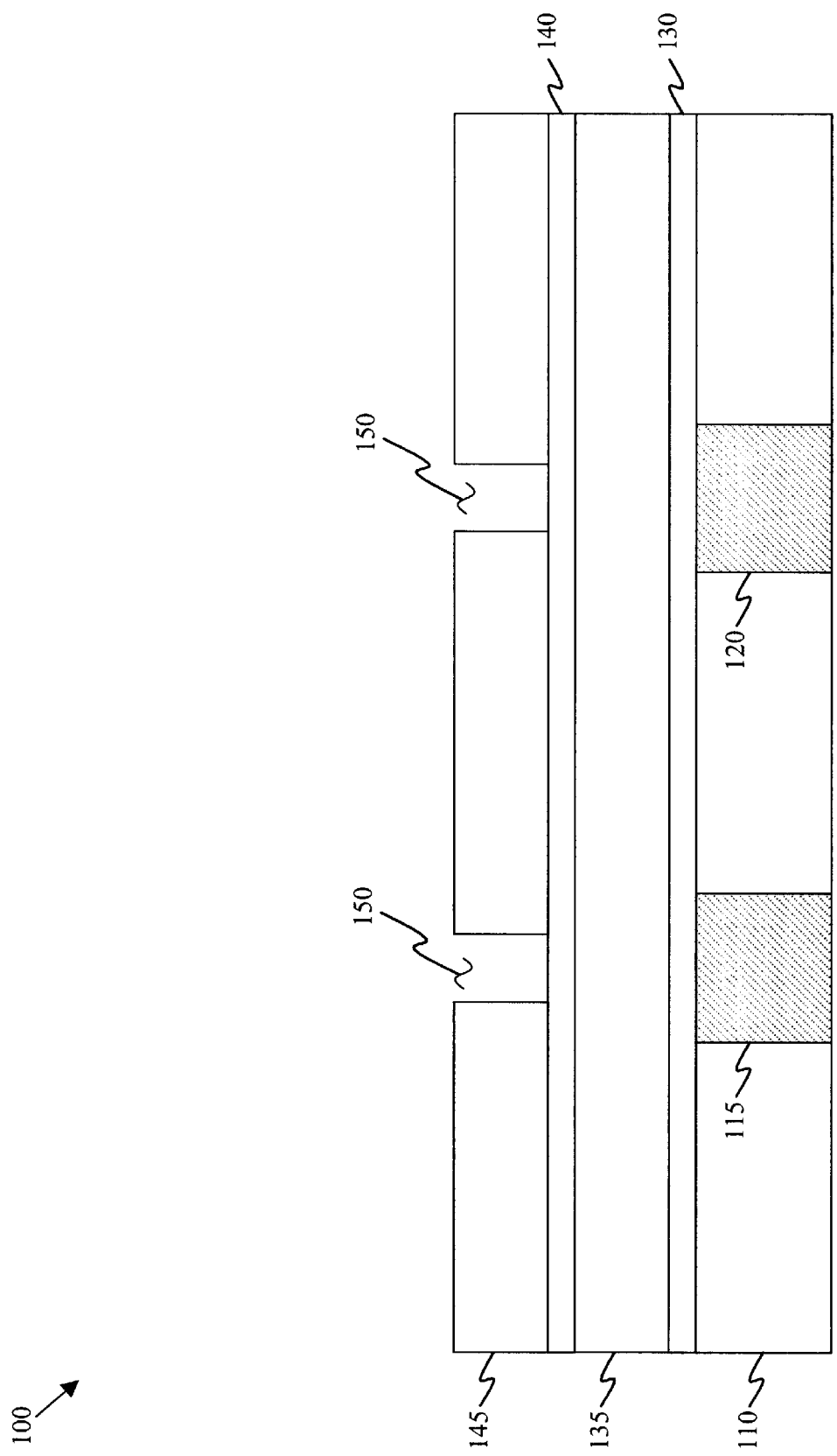
FIG. 1 illustrates a partial sectional view of a semiconductor device at an intermediated phase of production.

Referring initially to FIG. 1, illustrated is a partial sectional view of a semiconductor device 100 at an intermediate phase of production. The semiconductor device 100 includes a semiconductor substrate 110, having a first interconnect structure 115 and a second interconnect structure 120 located therein. A semiconductor substrate 110 may be any substrate located in a semiconductor device 100, including a substrate located at wafer level or a substrate located above wafer level. The interconnect structures 115, 120, are conventionally formed, typically using a damascene etch process or reactive ion etch (RIE) process, in a previous step, not shown. The interconnect structures 115, 120, typically comprise a highly conductive metal, such as aluminum or tungsten; however, in a preferred embodiment the interconnect structures 115, 120, may comprise copper.

Also illustrated in FIG. 1 are a first dielectric etch stop layer 130, a first interlevel dielectric layer 135, a second dielectric etch stop layer 140 and a second interlevel dielectric layer 145. The dielectric etch stop layers 130, 140, may comprise silicon nitride or any other similar etch stop material. It should be noted that while two etch stop layers are shown, other embodiments may have only one etch stop layer. The interlevel dielectrics 135, 145, may comprise silicon dioxide or any other dielectric material known for use in a semiconductor device. The layers 130, 135, 140, 145, are preferably formed by conventional deposition processes in a previous step, not shown. Two vias 150 have also been conventionally formed within and through the second interlevel dielectric layer 145.

Figure 2:
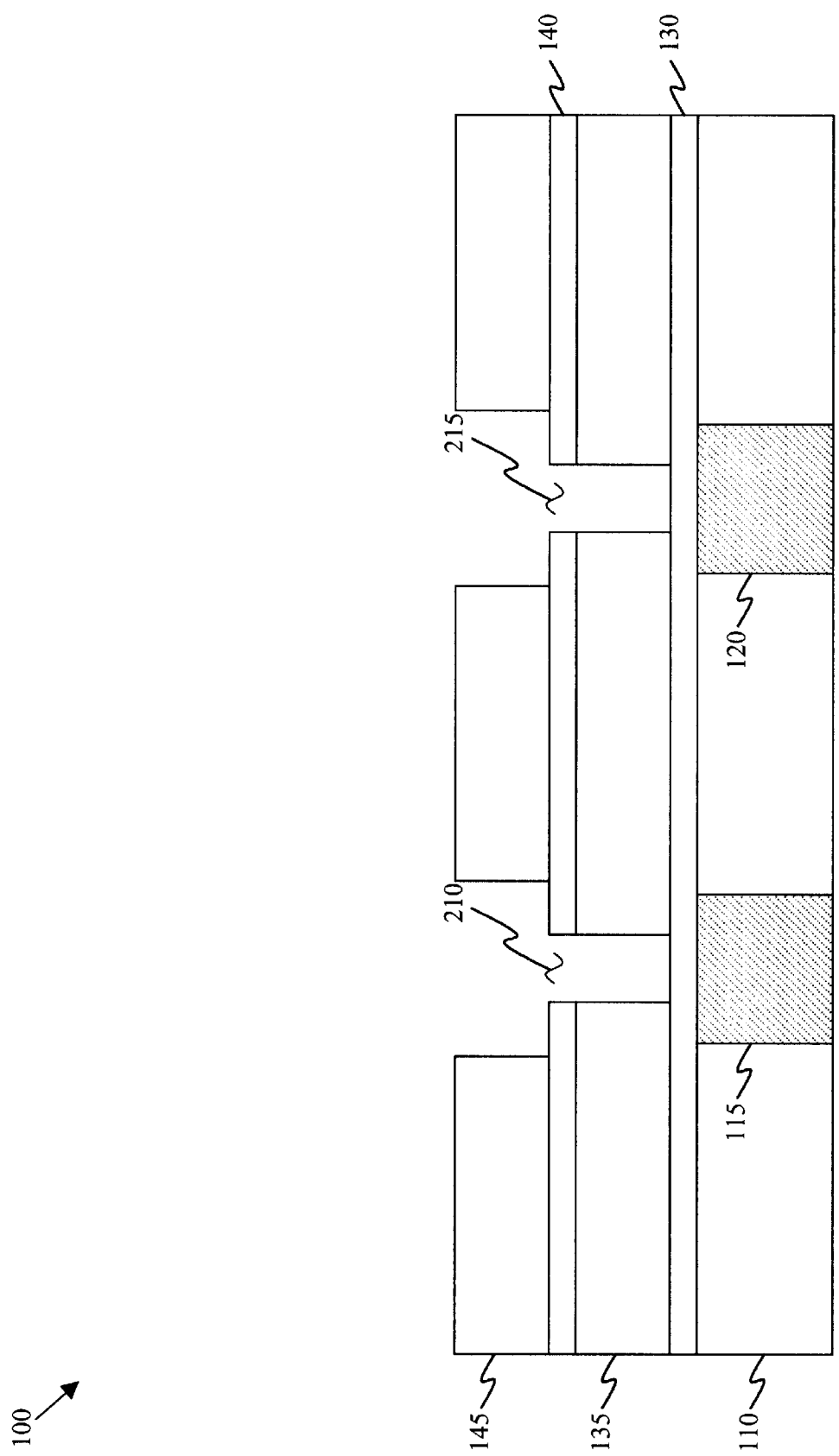
FIG. 2 illustrates the semiconductor device illustrated in FIG. 1, after an additional damascene trench etch.

Turning to FIG. 2, illustrated is the semiconductor device 100 illustrated in FIG. 1, after an additional damascene trench etch. First and second damascene trenches 210, 215, have been conventionally formed through the layers 135, 140, 145, and down to the first etch stop layer 130. In the illustrated embodiment, dual damascene trenches happen to be illustrated, however, one having skill in the art knows that where applicable, single damascene trenches may also be used.

Figure 3:
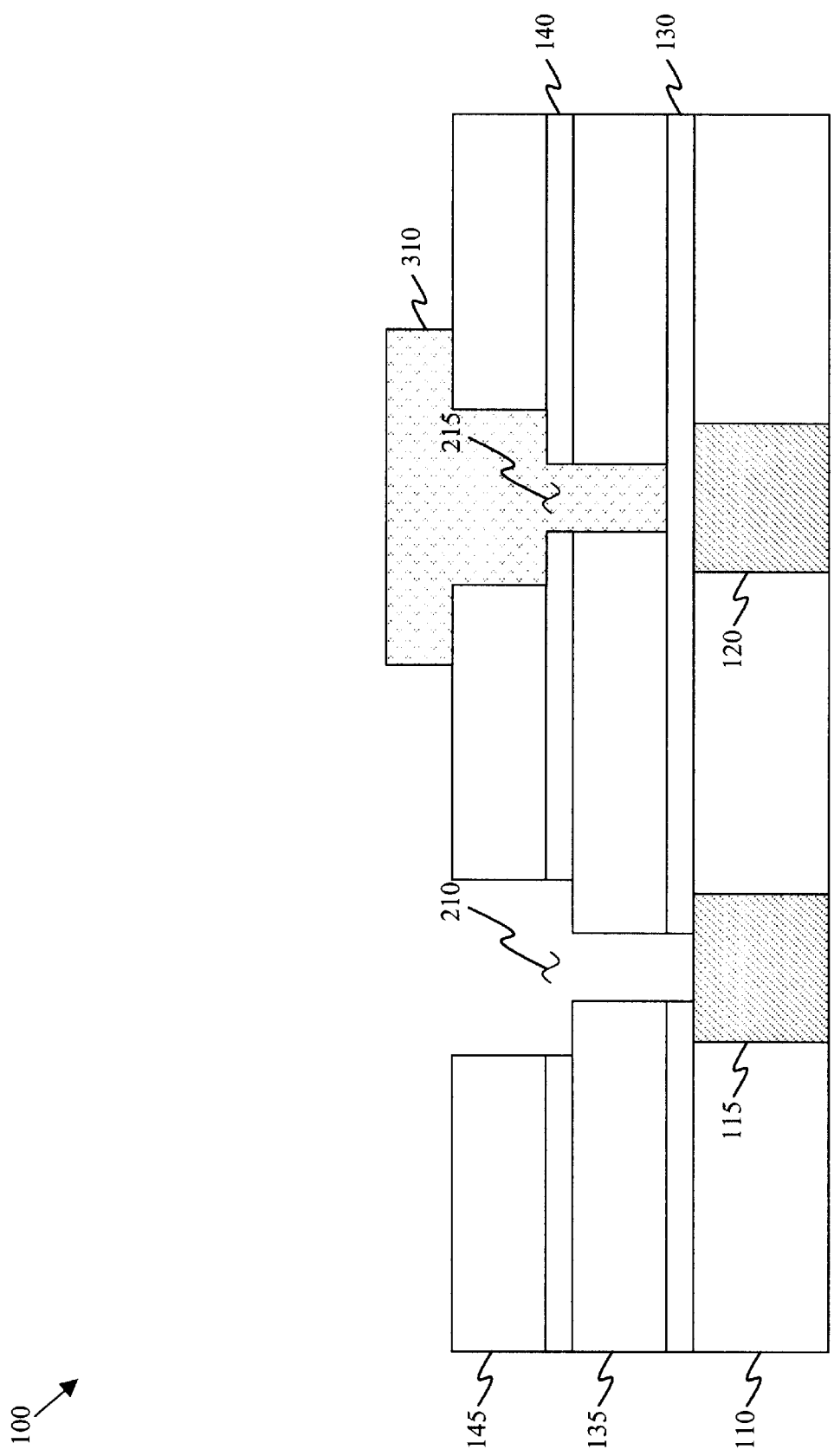
FIG. 3 illustrates the semiconductor device illustrated in FIG. 2, after a subsequent removal of the first etch stop layer within the first dual damascene trench.

Turning to FIG. 3, illustrated is the semiconductor device 100 illustrated in FIG. 2, after a subsequent removal of the first and second etch stop layers 130, 140, within the first dual damascene trench 210. To remove the first and second etch stop layers 130, 140, within the first dual damascene trench 210, a photoresist layer is first conventionally deposited over the entire surface of the semiconductor device 100 and patterned, leaving the photoresist 310 protecting the second dual damascene trench 215. An etch process, appropriately designed to remove the exposed portions of the first and second etch stop layers 130, 140, is then performed, resulting in the intermediate semiconductor device 100 illustrated in FIG. 3. As illustrated, the first damascene trench 210 goes through the first etch stop layer 130 and contacts the first interconnect structure 115. After the removal of the first etch stop layer 130 within the first damascene trench 210 is complete, the photoresist 310 is removed.

Figure 4:
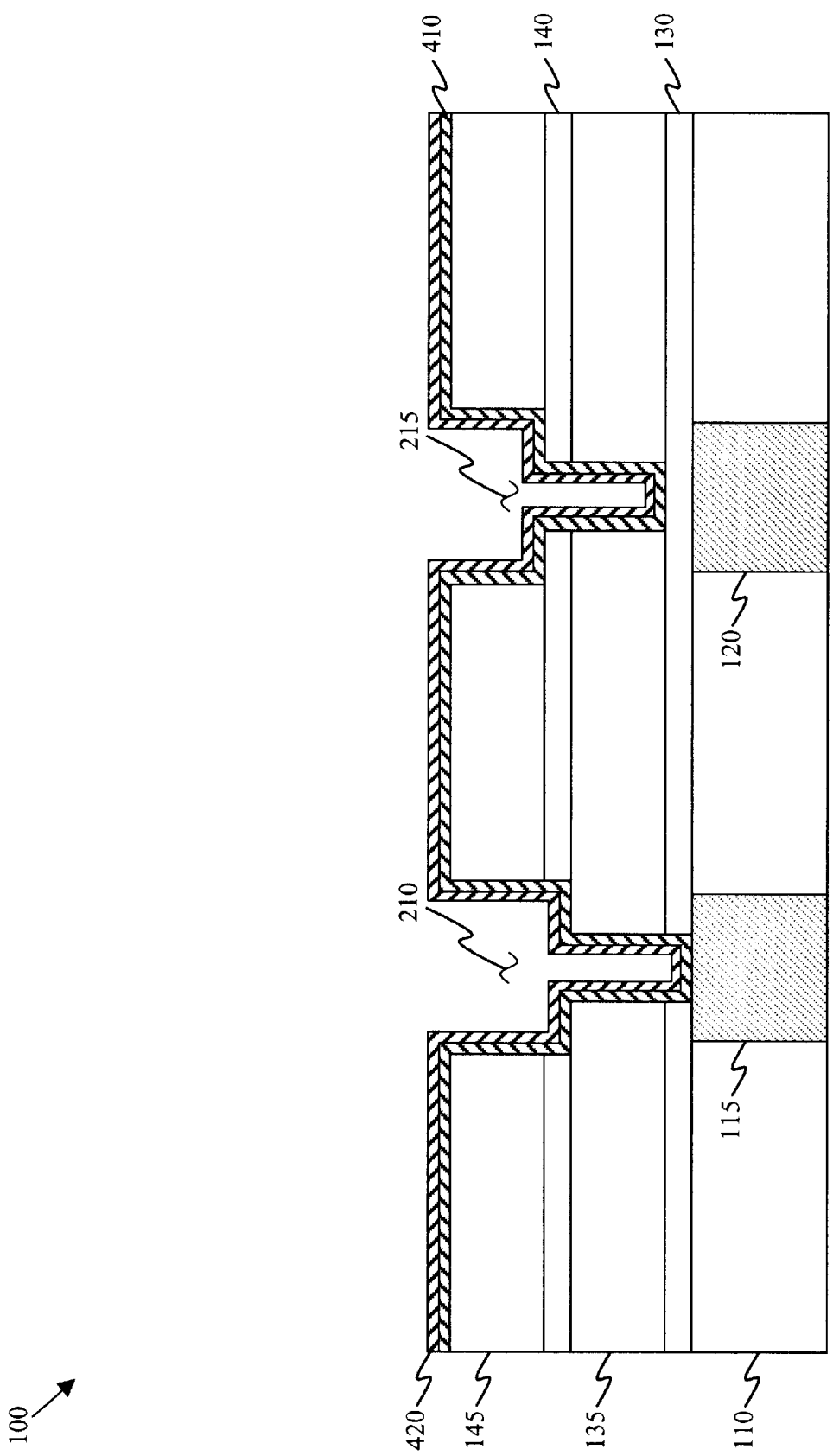
FIG. 4 illustrates the semiconductor device illustrated in FIG. 3, including an additional and optional barrier layer.

As illustrated in FIG. 4, a barrier layer 410 may be conventionally deposited over the entire surface of the semiconductor device 100. The barrier layer 410 is typically only required when diffusion occurs between the first and second interlevel dielectric layers 135, 145, and the metal formed within the first and second damascene trenches 210, 215, in a subsequent processing step. More specifically, a barrier layer is generally used when copper is the metal subsequently formed within the first and second damascene trenches 210, 215. The barrier layer 410 may be tantalum, tantalum nitride, titanium nitride or any other suitable barrier layer capable of preventing diffusion between the metal and interlevel dielectric layers 135, 145. Moreover, the barrier layer 410 may comprise multiple barrier layers. Likewise, the thickness of the barrier layer 410 may vary depending on the barrier layer material and the two materials that the barrier layer 410 separates.

Also illustrated in FIG. 4 is an optional seed layer 420. The seed layer 420 may or may not be present in any particular embodiment, depending on the materials used and the deposition processes used to deposit those materials. For example, if the metal is to be deposited within the damascene trenches 210, 215 by an electrodeposition processes, the seed layer 420 may be present. In one embodiment, copper is commonly used within interconnects, and as such, electrodeposition is a common deposition process used to deposit copper within the damascene trenches 210, 215.

Figure 5:
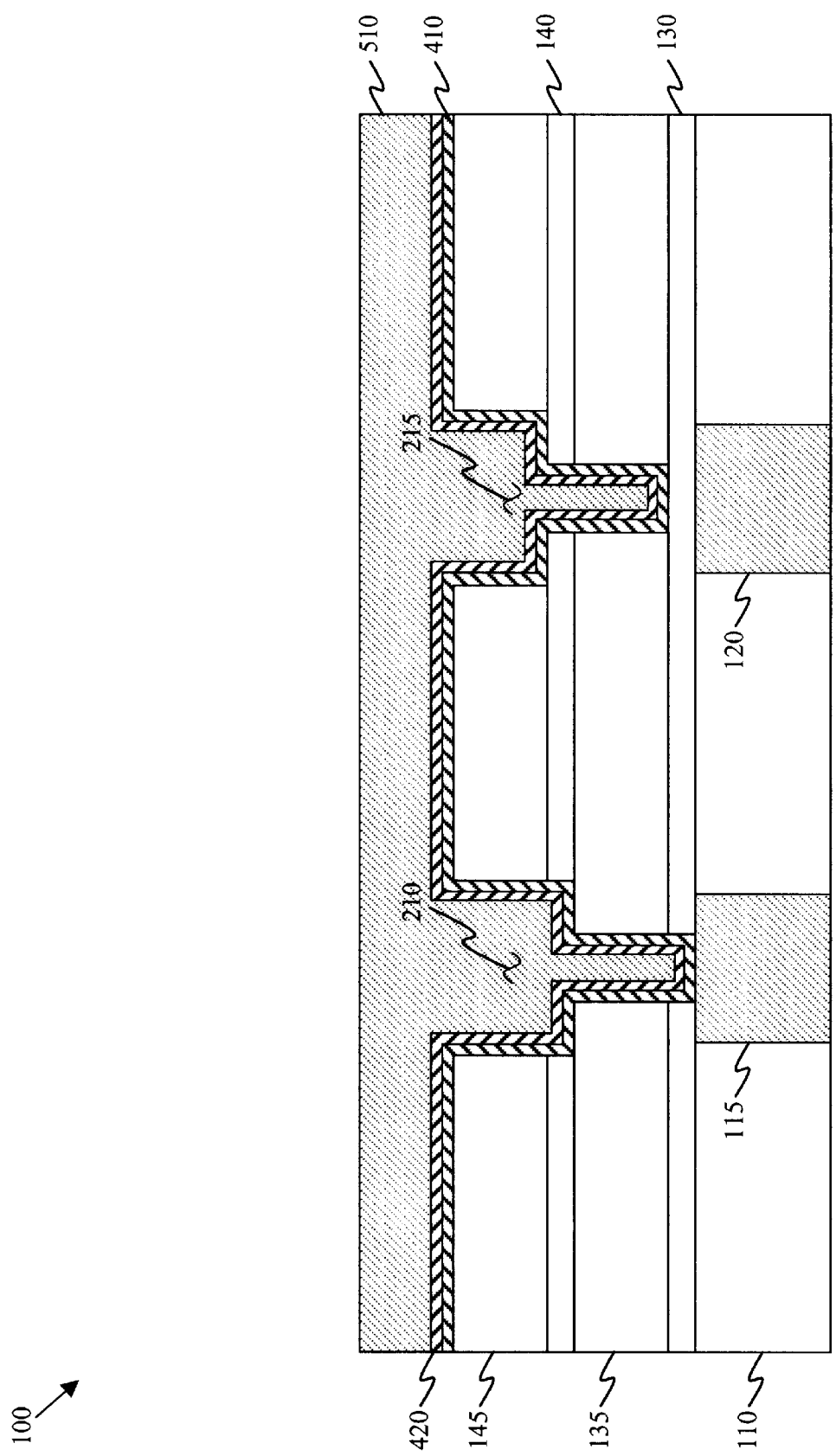
FIG. 5 illustrates the semiconductor device illustrated in FIG. 4 after a conventional and conformal deposition of a metal layer over the entire surface of the semiconductor device, including within the first and second damascene trenches.

Turning to FIG. 5, illustrated is the semiconductor device 100 illustrated in FIG. 4 after a conventional deposition of a metal layer 510 over the entire surface of the semiconductor device 100, including within the first and second damascene trenches 210, 215. One having skill in the art knows the processes by which the metal layer 510 may be deposited, including conventional chemical vapor deposition (CVD), physical vapor deposition (PVD) and electrodeposition processes. The metal layer 510 may comprise aluminum, tungsten or any other material consistent with the design of the device. Furthermore, in a preferred embodiment the metal layer 510 may comprise copper. As mentioned earlier, the seed layer 420 may be present within the structure when electrodeposition is used to deposit the metal layer 510.

Figure 6:
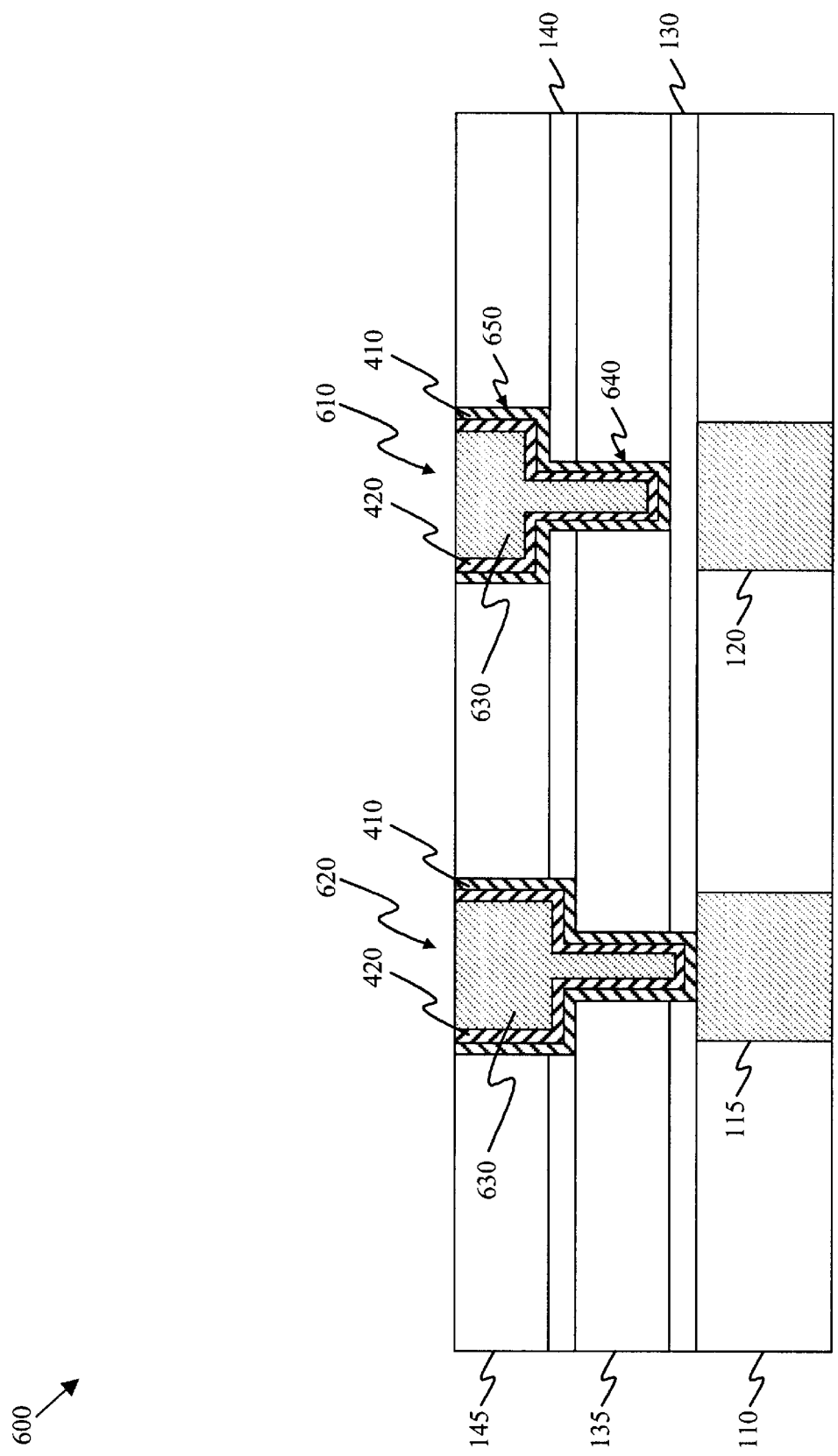
FIG. 6 illustrates a completed semiconductor device after conventional chemical mechanical polishing (CMP) the metal layer illustrated in FIG. 5.

Illustrated in FIG. 6 is a completed semiconductor device 600 after conventional chemical mechanical polishing (CMP) of the metal layer 510 illustrated in FIG. 5. What results, is a MOS capacitor damascene structure 610 and a damascene interconnect structure 620, both of which may form part of a larger integrated circuit. As illustrated, the MOS capacitor 610 is located over the second interconnect structure 120. The MOS capacitor 610 uses the second interconnect structure 120 as the first capacitor electrode, uses the first dielectric etch stop layer 130 as the capacitor dielectric and uses the metal 630, which is what remains of metal layer 510 (FIG. 5) following CMP, as the second capacitor electrode. Likewise, the damascene interconnect structure 620 contacts the first interconnect structure 115 and includes the barrier layer 410 and seed layer 420, when desired. Also illustrated, is an embodiment wherein the MOM capacitor damascene structure 610 includes a via portion 640 and a trench portion 650. The via portion 640 extends to the etch stop layer 130 and the trench portion 650 extends to the etch stop layer 140. However, in an alternative embodiment, the trench portion 650 may extend through the etch stop layer 140.

Figure 7:
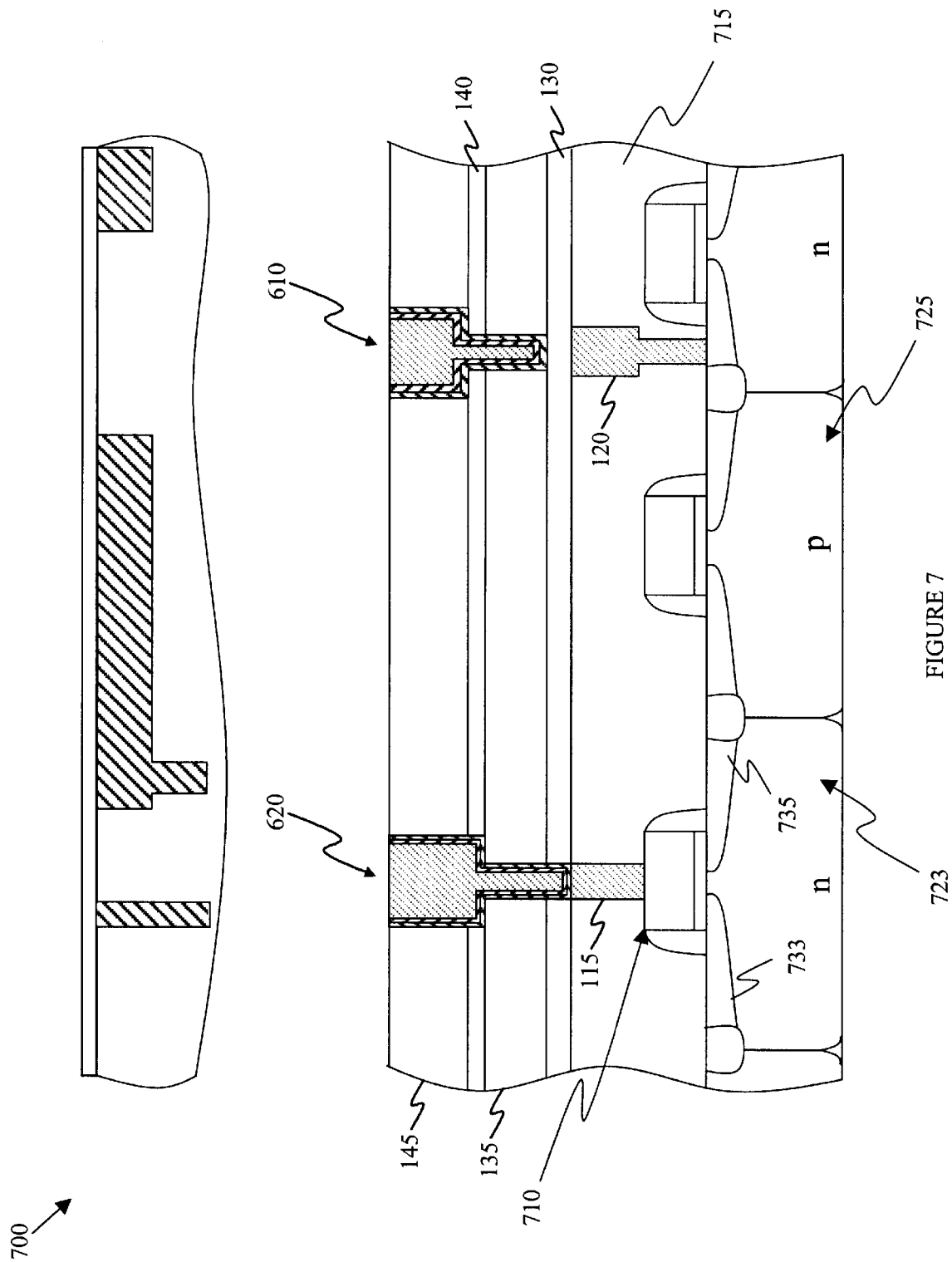
FIG. 7 illustrates a sectional view of a conventional integrated circuit that might be manufactured according to the principles of the present invention.

Turning briefly to FIG. 7, there is illustrated a sectional view of a conventional integrated circuit 700, including the MOM capacitor damascene structure 610 and the interconnect damascene structure 620, that might be manufactured according to the principles of the present invention. The integrated circuit 700 may be a CMOS device, a BiCMOS device, a Bipolar device or any other type of device. Also shown in FIG. 7 are components of the conventional integrated circuit 700, including: transistors 710, dielectric layers 715, 135, 145, in which interconnect structures 115, 120, may be formed. The interconnect structures 115, 120, connect the transistors 710 to other areas of the integrated circuit 700 and provide a bottom electrode of the MOM capacitor damascene structure 610, respectively. Also illustrated, are conventionally formed tubs, 723, 725, source regions 733 and drain regions 735.

Thus, the present invention provides a semiconductor device having a damascene structure incorporated therein and a MOM capacitor associated with the damascene interconnect structure. Given this unique structure, the damascene interconnect structure and the MOM capacitor can very easily and cost effectively be manufactured. In preferred embodiments, only one photoresist mask is required to fabricate the combination damascene interconnect structure and MOM capacitor. Thus, the semiconductor device, including the damascene interconnect structure and the MOM capacitor, may be manufactured very easily and with a minimum amount of cost involved, while avoiding the problems associated with etching copper.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   a damascene interconnect structure formed through a first interlevel dielectric layer and a first dielectric etch stop layer located under the first interlevel dielectric layer and formed through a second interlevel dielectric layer and a second dielectric etch stop layer located under the second interlevel dielectric layer, the damascene interconnect structure contacting a first interconnect structure located below the second dielectric etch stop layer; and
   a metal-oxide-metal capacitor including:
      a first electrode damascene structure formed through the first and second interlevel dielectric layers and the first dielectric etch stop layer and that terminates on the second dielectric etch stop layer and being located over the second dielectric etch stop layer and a second interconnect structure.

2. The semiconductor device as recited in claim 1 wherein a second capacitor electrode of the metal-xide-metal capacitor is the second interconnect structure, and a capacitor dielectric is the second dielectric etch stop layer.

3. The semiconductor device as recited in claim 1 wherein the second dielectric etch stop layer is silicon nitride.

4. The semiconductor device as recited in claim 1 wherein the first and second interlevel dielectric layers are silicon dioxide.

5. The semiconductor device as recited in claim 1 wherein the damascene interconnect structure comprises copper.

6. The semiconductor device as recited in claim 1 wherein first and second electrodes of the metal-oxide-metal capacitor damascene structure comprise copper.

7. The semiconductor device as recited in claim 1 wherein the metal-oxide-metal capacitor damascene structure includes a barrier layer.

8. The semiconductor device as recited in claim 7 wherein the barrier layer is tantalum nitride, tantalum or titanium nitride.

9. The semiconductor device as recited in claim 1 wherein the damascene interconnect structure and the metal-oxide-metal capacitor damascene structure form a part of an integrated circuit.

10. The semiconductor device as recited in claim 1 wherein the damascene interconnect structure is a dual damascene interconnect structure.

* * * * *